United States Patent
Masghati

(10) Patent No.: US 6,721,156 B2
(45) Date of Patent: Apr. 13, 2004

(54) PRIMARY/SECONDARY WIRELESS PROTECTOR

(75) Inventor: Mohammad Masghati, Carol Stream, IL (US)

(73) Assignee: Illinois Tool Works Inc., Glenview, IL (US)

( * ) Notice: Subject to any disclaimer, the term of this patent is extended or adjusted under 35 U.S.C. 154(b) by 132 days.

(21) Appl. No.: 10/044,138

(22) Filed: Jan. 11, 2002

(65) Prior Publication Data

US 2003/0133246 A1 Jul. 17, 2003

(51) Int. Cl.⁷ ................................................ H02H 9/06
(52) U.S. Cl. ........................... 361/119; 361/56; 361/58; 361/118; 361/120
(58) Field of Search ................................ 361/119, 120, 361/56, 58, 91, 111, 113, 128, 129, 130, 54, 118, 127

(56) References Cited

U.S. PATENT DOCUMENTS

| | | | | |
|---|---|---|---|---|
| 4,907,120 A | * | 3/1990 | Kaczmarek et al. | |
| 4,941,063 A | * | 7/1990 | McCartney et al. | |
| 5,493,469 A | * | 2/1996 | Lace | |
| 5,841,620 A | * | 11/1998 | Masghati | |
| 6,385,030 B1 | * | 5/2002 | Beene | |

* cited by examiner

*Primary Examiner*—Dean A. Reichard
*Assistant Examiner*—Nguyen T. Ha
(74) *Attorney, Agent, or Firm*—Mark W. Croll; Paul F. Donovan

(57) ABSTRACT

A primary/secondary surge protector circuit for protecting telecommunications equipment from power and surge transients includes a printed circuit board and a surge protector circuit. The surge protector circuit is mounted on the printed circuit board. The printed circuit board has tip and ring conductive traces formed on its top surface. The surge protector circuit includes a voltage suppressor operatively coupled to the tip and ring conductive traces. The tip and ring conductive traces define fusible links which are opened when an excessive current is passed through so as to meet the specifications set forth by UL Standards 497 and 497A.

17 Claims, 3 Drawing Sheets

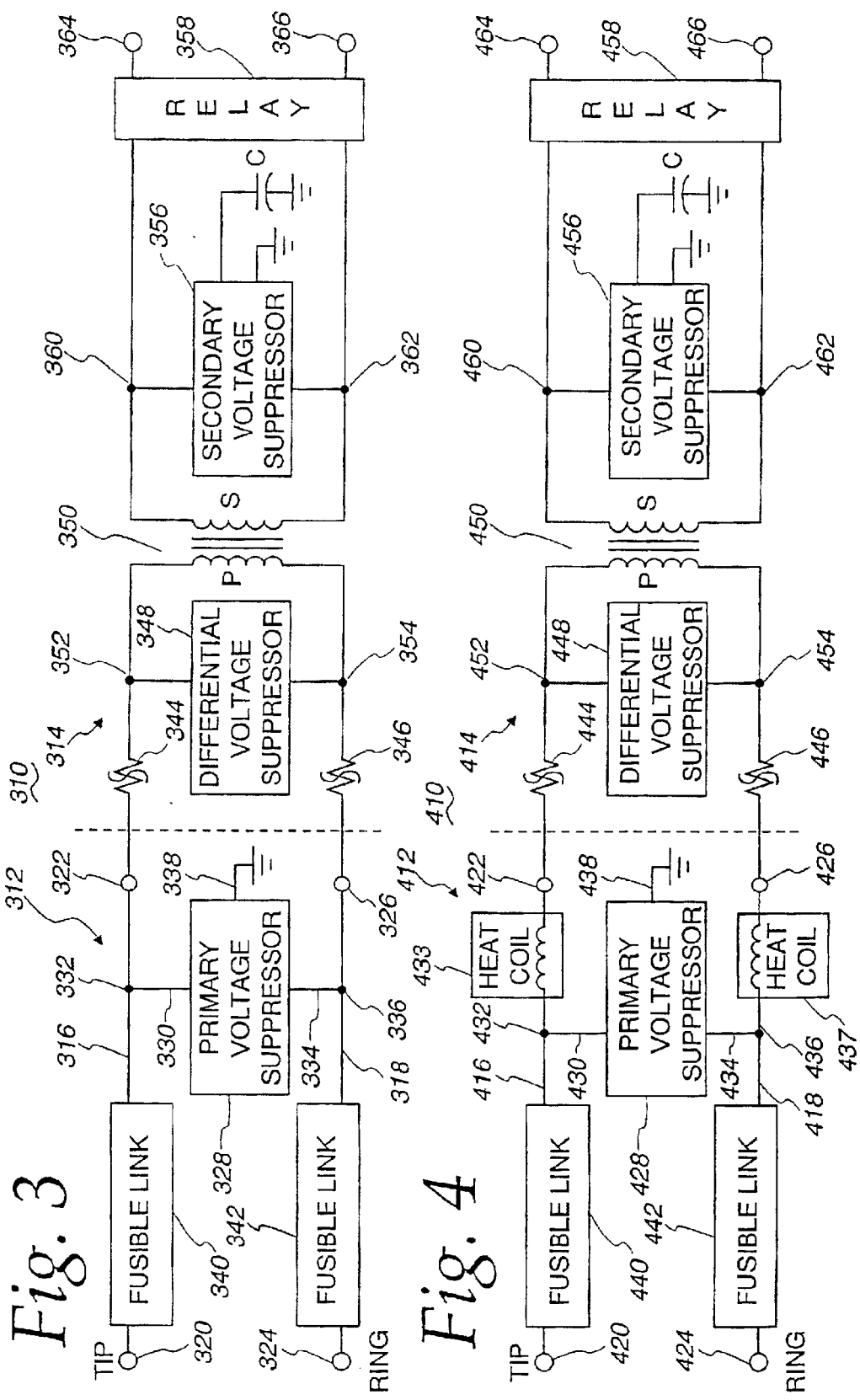

PRIMARY/SECONDARY WIRELESS PROTECTOR

BACKGROUND OF THE INVENTION

This invention relates generally to primary/secondary surge protection devices for protecting telephone communications related equipment from power and transient surges. More particularly, the present invention relates to an improved primary/secondary surge protector circuit for protecting telecommunication equipment from power and transient surges occurring on the tip and/or ring conductors of transmission lines connected thereto. Specifically, the primary/secondary surge protector circuit of the instant invention includes fusible links of a unique construction connected in series with a primary voltage suppressor formed as a single unit on a printed circuit board.

As is generally well-known to those skilled in the telecommunications industry, modern telecommunications equipment is susceptible to transient surges such as those caused by lightning strikes and other voltage surges on the transmission lines. Accordingly, primary surge protector circuits are known in the prior art which have been provided for connection to the incoming transmission lines so as to be normally non-conductive but are rendered conductive when a voltage surge exceeds a predetermined breakdown voltage (e.g., 250 V) for protecting the equipment. However, it is also known that voltage surges on the transmission lines which are well below the breakdown voltage of the primary surge protector circuit may nevertheless create possible damage to the equipment. Thus, telecommunication equipment manufacturers have also typically provided some type of secondary surge protection in conjunction with the primary surge protector circuits.

As is shown in FIG. 1, a prior art primary/secondary surge protector circuit includes a primary protector portion and a secondary protector portion. The primary protector portion is comprised of a primary voltage suppressor and a pair of bridle wires connected in series with the opposite ends of the voltage suppressor which are mounted on a printed circuit board. The bridle wires are either short pieces of gauged wire (e.g., #28 AWG size or less) or a fuse element. The bridle wires are required in order to meet or pass the primary test according to the specification set forth by UL Standards 497 and 497A. However, the use of the bridle wires in the form of short wires or fuse elements mounted on the printed circuit board has the disadvantages of increasing space requirements and costs. In addition, the bridle wires require the additional task of installation or assembly, thereby increasing manufacturing costs.

In view of these problems, the inventors have developed a way of replacing the short wires or fuse elements with fusible links consisting of tip and ring conductive traces of a unique construction formed on the printed circuit board.

SUMMARY OF THE INVENTION

Accordingly, it is a general object of the present invention to provide an improved primary/secondary surge protector circuit for protecting telecommunication equipment from power and transient surges which is relatively simple and economical to manufacture and assemble.

It is an object of the present invention to provide an improved primary/secondary surge protector circuit which meets the specifications set forth by UL Standards 497 and 497A.

It is still another object of the present invention to provide an improved primary/secondary surge protector circuit which includes fusible links of a unique construction connected in series with a primary voltage suppressor formed as a single unit on a printed circuit board in order to pass the primary test of the UL Standards 497 and 497A.

It is still yet another object of the present invention to provide an improved primary/secondary surge protector circuit which is characterized by a design wherein fusible links consisting of tip and ring conductive traces of a unique construction are formed on a printed circuit board.

In a preferred embodiment of the present invention, there is provided a primary/secondary surge protector circuit for protecting telecommunications equipment and the like from power and transient surges which includes a printed circuit board and a surge protector circuit. The surge protector circuit is mounted on the printed circuit board. The printed circuit board has at least one tip conductor trace formed on its top surface and extending between an input tip terminal pin and a first internal node and has at least one ring conductive trace formed on its top surface and extending between an input ring terminal pin and a second internal node.

The surge protector circuit includes a voltage suppressor operative connected to the tip conductive trace at the first node and to the ring conductive trace at the second node. The tip and ring conductive traces define fusible links which are open when an excessive current is passed therethrough.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 3 is a schematic circuit diagram of a primary/secondary surge protector circuit, constructed in accordance with the principles of the present invention;

FIG. 4 is a schematic circuit diagram of a second embodiment of a primary/secondary surge protector circuit in accordance with the present invention;

FIG. 6 is an enlarged, cross-sectional view, taken along the lines 6—6 of FIG. 5a;

FIG. 8 is an enlarged, cross-sectional view, taken along the lines 7—7 of FIG. 7a.

DESCRIPTION OF THE PREFERRED EMBODIMENTS

Figure 1:
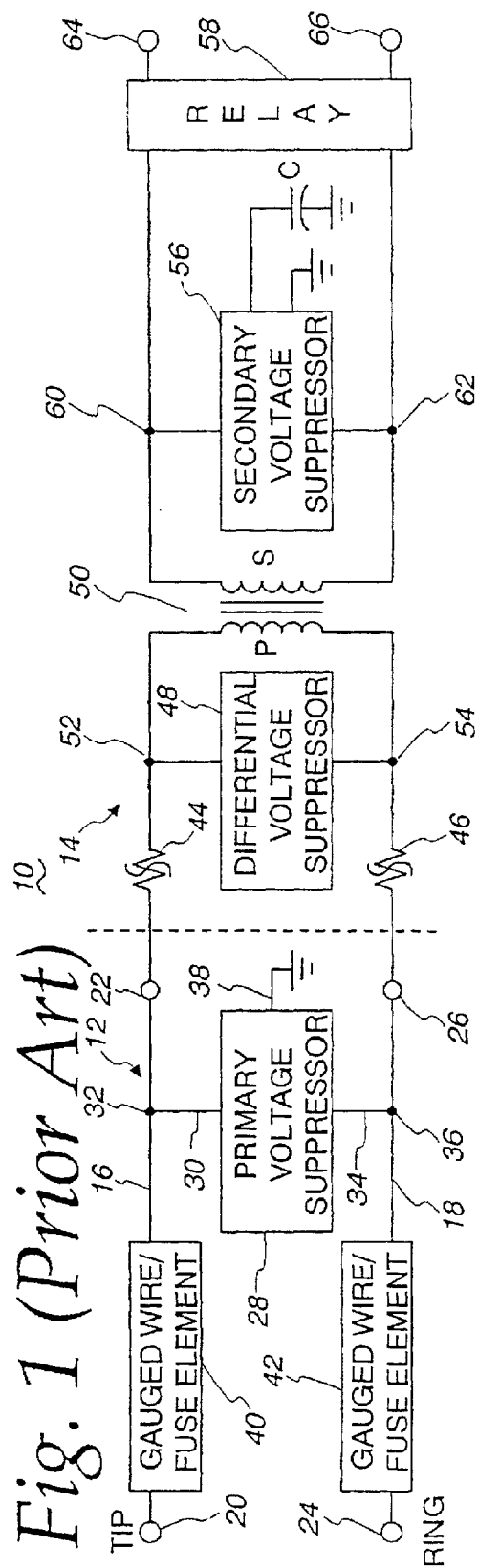
FIG. 1 is a schematic circuit diagram of a prior art primary/secondary surge protector circuit.

It is to be distinctly understood at the outset that the present invention shown in the drawings and described in detail in conjunction with the preferred embodiments is not intended to serve as a limitation upon the scope or teachings thereof, but is to be considered merely as an exemplification of the principles of the present invention.

Referring now in detail to the drawings, there is illustrated in FIG. 1 a schematic circuit diagram of a prior art primary/secondary surge protector 10 for protecting telecommunications equipment from power and transient surges occurring on tip and/or ring conductors of transmission lines connected thereto. The surge protector circuit 10 is comprised of a primary protector portion 12 and a secondary protector portion 14. The primary portion 12 of the surge protector circuit 10 includes first and second data signal conductors 16 and 18. One end of the first conductor 16 is coupled to an input tip terminal pin 20 and its other end thereof is coupled to an output tip terminal pin 22. Similarly, one end of the second conductor 18 is coupled to an input ring terminal pin 24 and its other end is coupled to an output ring terminal pin 26.

The primary portion 12 of the surge protector circuit 10 includes a primary voltage suppressor 28 having a first lead 30 connected to the first conductor 16 at an internal node 32 and a second lead 34 connected to the second conductor 18 at an internal node 36. A third lead 38 of the voltage suppressor 28 is connected to a ground potential. A first bridle wire 40 in the form of a short piece of gauged wire or fuse element is interconnected between the input tip terminal pin 20 and the internal node 32. A second bridle wire 42 in the form of a short piece of gauged wire or fuse element is interconnected between the input ring terminal pin 24 and the internal node 36.

The secondary portion 14 of the surge protector circuit 10 includes a pair of positive thermal coefficient (PTC) resistors 44, 46, a differential voltage suppressor 48, and an isolation transformer 50. The differential voltage suppressor 48 is connected in parallel across the primary windings P of the transformer 50 at nodes 50, 54 respectively. The PTC resistor 44 has its ends interconnected between the output tip terminal pin 22 and the node 52. The PTC resistor 46 has its ends interconnected between the output ring terminal pin 26 and the node 54.

The secondary portion 14 further includes a secondary voltage suppressor 56 and a relay 58. The secondary voltage suppressor 56 is connected in parallel across the secondary windings S of the transformer 50 at nodes 60, 62 respectively. The relay 58 is interconnected between the respective nodes 60, 62 and corresponding equipment terminals 64, 66 which are connected to the telephone communications equipment (not shown) to be protected.

As previously pointed out, in the primary protector portion 12 the primary voltage suppressor 28, the first short piece of gauged wire or fuse element (bridle wire 40) and the second short piece of gauged wire or fuse link (bridle wire 42) are all mounted on a printed circuit board. As a result, the primary protector portion 12 suffers from the drawbacks of increased space requirements and higher costs. Further, the added task required for installing or assembling of the bridle wires 40, 42 will also increase time-consuming labor costs during manufacturing.

Figure 2:
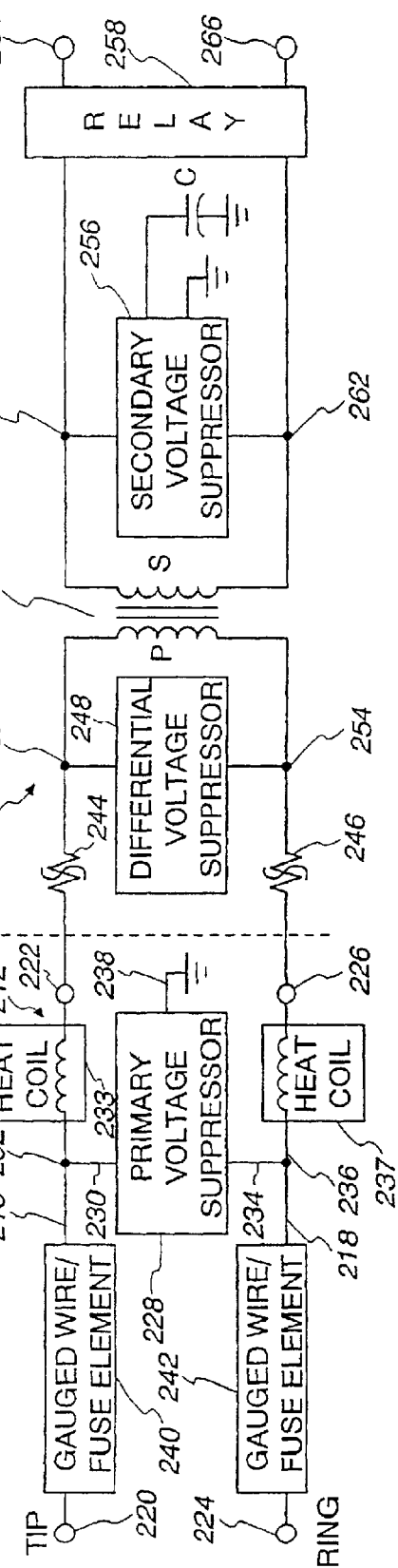
FIG. 2 is a schematic circuit diagram of another prior art primary/secondary surge protector circuit, similar to FIG. 1, but further includes heat coils.

In FIG. 2, there is shown a schematic circuit diagram of another embodiment of a prior art primary/secondary surge protector circuit 210 for protecting the telecommunications equipment. The surge protector circuit 210 is comprised of a primary protector portion 212 and a secondary protector portion 214. The primary portion of the surge protector circuit 210 includes first and second data conductors 216 and 218. One end of the first conductor 216 is coupled to an input tip terminal pin 220 and its other end thereof is coupled to an output tip terminal pin 222. Similarly, one end of the second conductor 218 is coupled to an input ring terminal pin 224 and its other end thereof is coupled to an output ring terminal pin 226.

The primary portion 212 of the surge protector circuit 210 includes an primary voltage suppressor 228 having a first lead 230 connected to the first conductor 216 at an internal node 232 and a second lead 234 connected to the second conductor 218 at an internal node 236. A third lead 238 of the voltage suppressor 228 is connected to a ground potential. A first bridle wire 240 in the form of a short piece of gauged wire or fuse element is interconnected between the input tip terminal pin 220 and the internal node 232. A second bridle wire 242 in the form of a short piece of gauged wire or fuse element is interconnected between the input ring terminal pin 224 and the internal node 236. As thus far described, the primary portion 212 is identical to the primary portion 12 of FIG. 1. In addition, the primary portion 212 includes a first heat coil 233 interconnected between the internal node 232 and the output tip terminal pin 222 and a second heat coil 237 interconnected between the internal node 236 and the output ring terminal pin 226.

Since the secondary portion 214 is identical in its construction to the secondary portion 14 of FIG. 1, it is believed unnecessary to describe in detail the same. However, it should be noted that the surge protector circuit 210 of FIG. 2 suffers from all of the same disadvantages of the surge protector circuit 10 of FIG. 1.

In order to overcome all of the problems associated with the surge protector circuits of FIGS. 1 and 2 but yet still pass the primary test according to the specifications set forth by UL Standards 497 and 497A, the inventors of the present invention have developed an improved primary/secondary surge protector circuit which includes fusible links of a unique construction for replacing the short pieces of gauged wire or fuse elements shown in FIGS. 1 and 2. The fusible links take the physical form of tip and ring conductive traces which are especially designed to have predetermined width and height (thickness) dimensions. By varying the width and height dimensions of the conductive traces, the conductive traces can be made to correspond to any one of a number of wire gauge sizes, such as #28 AWG size or less, respectively. The conductive traces will create a discontinuity or open up when heated due to an excessive current being passed through it.

With reference now to FIG. 3 of the drawings, there is depicted a schematic circuit diagram of an improved primary/secondary surge protector circuit 310 for protecting telecommunications equipment from power and transient surges occurring on tip and/or ring conductors of transmission lines connected thereto, constructed in accordance with the principles of the present invention. The surge protector circuit 310 is comprised of a primary protector portion 312 and a secondary protector portion 314. The primary portion 312 of the surge protector circuit 310 includes first and second data signal conductors 316 and 318. One end of the first conductor 316 is coupled to an input tip terminal pin 320 and its other end thereof is coupled to an output tip terminal pin 322. Similarly, one end of the second conductor 318 is coupled to an input ring terminal pin 324 and its other end thereof is coupled to an output ring terminal pin 326.

The primary portion 312 of the surge protector circuit 310 includes a primary voltage suppressor 328 having a first lead 330 connected to the first conductor 316 at an internal node 332 and a second lead 334 connected to the second conductor 318 at an internal node 336. A third lead 338 of the voltage suppressor 328 is connected to a ground potential. A first fusible link 340 in the form of tip conductive trace is interconnected between the input terminal pin 320 and the internal node 332. A second fusible link 342 in the form of a ring conductive trace is interconnected between the input ring terminal 324 and the internal node 336. All of the electrical components between the input terminals 320, 324 and the output terminals 322, 326 are formed as a single unit on a printed circuit board.

The primary voltage suppressor 328 may be formed of a silicon avalanche suppressor (SAS), sidactor, gas discharge tube or other similar devices which have predetermined breakdown voltages that are relatively high, preferably in the range of approximately 200–600 volts. In the preferred embodiment, the primary voltage suppressor 328 is a silicon avalanche suppressor similar to type 1.5 KE.

The secondary portion 314 of the surge protector circuit 310 is identical in its construction to the secondary portion 14 of FIG. 1. In particular, the secondary portion 314 of the surge protector circuit 310 includes a pair of positive thermal coefficient (PTC) resistors 344, 346, a differential voltage suppressor 348, and an isolation transformer 350. The differential voltage suppressor 348 is connected in parallel across the primary windings P of the transformer 350 at nodes 352, 354 respectively. The PTC resistor 344 has its ends interconnected between the output tip terminal pin 322 and the node 352. The PTC resistor 346 has its ends interconnected between the output ring terminal pin 326 and the node 354.

The secondary portion 314 further includes a secondary voltage suppressor 356 and a relay 358. The secondary voltage suppressor 356 is connected in parallel across the secondary windings S of the transformer 350 at nodes 360, 362 respectively. The relay 358 is interconnected between the respective nodes 360, 362 and corresponding equipment terminals 364, 366 which are connected to the telephone communications equipment (not shown) to be protected.

Figure 5:
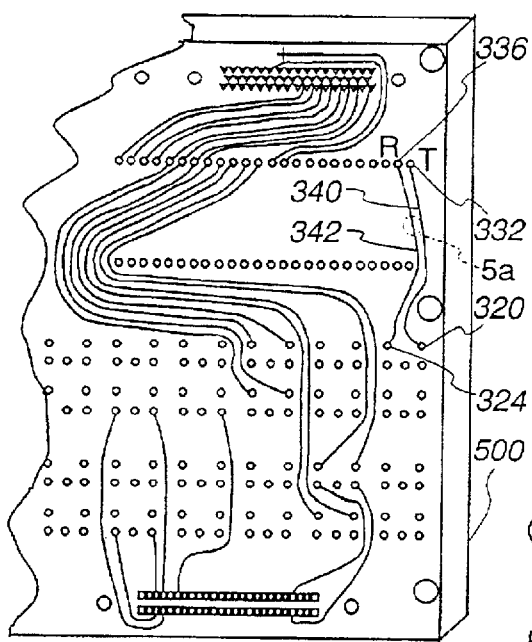
FIG. 5 is a simplified top plan view of a portion of a printed circuit board, illustrating certain ones of the conductive traces.
Figure 5A:
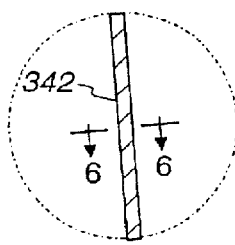
FIG. 5a is an enlarged view of the encircled area 5a of FIG. 5.
Figure 6:
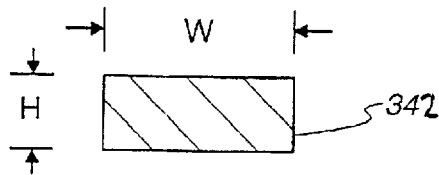

The unique construction of the fusible links 340 and 342 formed on a printed circuit board is best understood by reference to FIGS. 5, 5a and 6. As can be seen from FIGS. 5 and 5a, the fusible links 340 and 342 are identical in their construction and take the physical form of respective tip and ring conductive traces which are located on the top surface of a printed circuit board 500. The tip conductive trace 340 extends between the input tip terminal pin 320 and the internal node 332. Similarly, the ring conductive trace 342 extends between the input ring terminal pin 324 and the internal node 336. Each of the tip and ring conductive traces 340, 342 has a uniform width W and height H along the path between the respective input terminal pins and the corresponding internal nodes.

In FIG. 6, there is shown an enlarged cross-sectional view of the ring conductive trace 342 taken along the lines 6—6 of FIG. 5a. It will be noted that the width W has typically a dimension of approximately 0.040 inches, and the height H has a dimension of approximately 0.0028 inches so as to correspond to approximately a #28 AWG size. However, it should be clearly understood to those skilled in the art that the width and length dimensions can be varied as desired so as to correspond to any one of a number of gauged wire sizes.

With reference now to FIG. 4 of the drawings, there is illustrated a schematic circuit diagram of a second embodiment of an improved primary/secondary surge protector circuit 410 for protecting the telecommunication equipment in accordance with the present invention. The surge protector circuit 410 is comprised of a primary protector portion 412 and a secondary protector portion 414. The primary portion of the surge protector circuit 410 includes first and second data signal conductors 416 and 418. One end of the first conductor 416 is coupled to an input tip terminal pin 420 and its other end thereof is coupled to an output tip terminal pin 422. Similarly, one end of the second conductor 418 is coupled to an input ring terminal pin 424 and its other end thereof is coupled to an output ring terminal pin 426.

The primary portion 412 of the surge protector 410 includes a primary voltage suppressor 428 having a first lead 430 connected to the first conductor 416 and an internal node 432 and a second lead 434 connected to the second conductor 418 at an internal node 436. A third lead 438 of the voltage suppressor 428 is connected to a ground potential. A first fusible link 440 in the form of a tip conductive trace is interconnected between the input tip terminal pin 420 and the internal node 432. A second fusible link 442 in the form of a ring conductive trace is interconnected between the input ring terminal pin 424 and the internal node 436.

As thus far described, the primary portion 412 is identical to the primary portion 312 of FIG. 3. In addition, the primary portion 412 includes a first heat coil 433 interconnected between the internal node 432 and the output tip terminal pin 422 and a second heat coil 437 interconnected between the internal node 436 and the output ring terminal pin 426. Since the secondary portion 414 is identical in its construction to the secondary portion 314 of FIG. 3, it is believed unnecessary to describe in detail the same.

Figure 7:
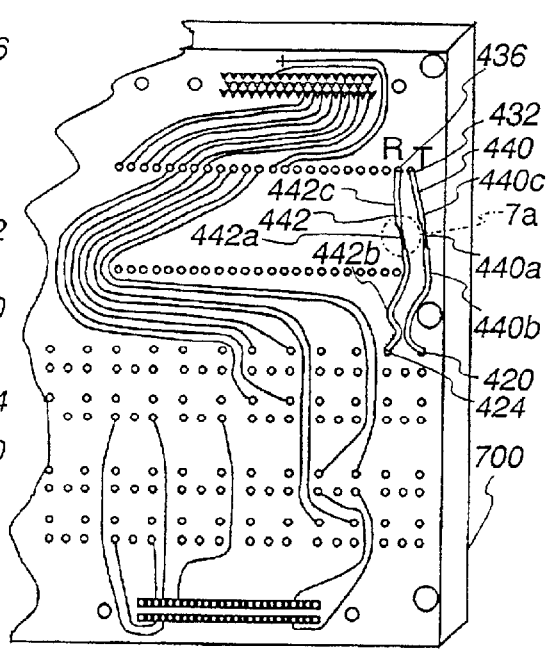
FIG. 7 is a simplified top plan view of a portion of a printed circuit board, illustrating an alternate embodiment of certain ones of the conductive traces.
Figure 7A:
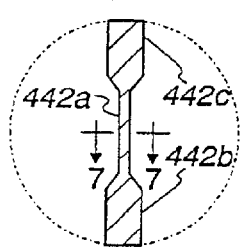
FIG. 7a is an enlarged view of the encircled area 7a of FIG. 7.
Figure 8:
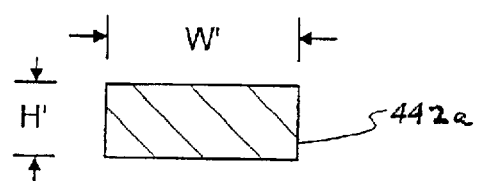

The unique construction of the fusible links 440 and 442 formed on a printed circuit board is best understood by reference to FIGS. 7, 7a and 8. As can be seen from FIGS. 7 and 7a, the fusible links 440 and 442 are identical in their construction and take the physical form of respective tip and ring conductive traces which are located on the top surface of a printed circuit board 700. The tip conductive trace 440 extends between the input terminal pin 420 and the internal node 432. Similarly, the ring conductive trace 442 extends between the input ring terminal pin 424 and the internal node 436. Unlike the tip and ring conductive traces 340, 342 of FIGS. 5, 5a and 6 having a uniform width and height throughout, the conductive traces 440, 442 have a respective reduced or necked-down section 440a, 442a which has a narrow width W' disposed substantially intermediate of wider sections 440b, 442b and 440c, 442c.

In FIG. 8, there is shown an enlarged cross-sectional view of the ring conductive trace 442, taken along the lines 7—7 of FIG. 7a. It will be noted that the width W' in the necked-down sections 442a has typically a dimension of approximately 0.020 inches and the height H' has a dimension of approximately 0.0028 inches. However, it should again be clear to those skilled in the art that the width and length dimensions can be varied as desired so as to correspond to a particular gauged wire size.

From the foregoing detailed description, it can thus be seen that the present invention provides an improved primary/secondary surge protector circuit for protecting telecommunication equipment and the like from power surges which includes a printed circuit board and a surge protector circuit. The surge protector circuit is mounted on the printed circuit board. The printed circuit board has tip and ring conductive traces formed on its top surface so as to define fusible links which are opened when an excessive current is passed therethrough. The conductive traces are dimensioned so as to pass the primary test according to the specifications set forth by UL Standards 497 and 497A.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A primary/secondary surge protector circuit for protecting telecommunications equipment and the like from power and transient surges, comprising:

a printed circuit board;

surge protector means;

said surge protector means being mounted on said printed circuit board;

said printed circuit board having at least one tip conductive trace formed on its surface and extending between an input terminal pin and a first internal node and having at least one ring conductive trace formed on its surface and extending between an input ring terminal pin and a second internal node;

said surge protector means including voltage suppressor means operatively connected to said tip conductive trace at said first node and to said ring conductive trace at said second node;

said tip and ring conductive traces defining fusible links which are opened when an excessive current is passed therethrough; and each of said tip and ring conductive traces having a first wider section, a second narrow section, and a third wider section, said second narrow section being interconnected between said first and third wider sections.

2. A primary/secondary surge protector circuit as claimed in claim 1, wherein each of said tip and ring conductive traces has uniform width and height dimensions.

3. A primary/secondary surge protector circuit as claimed in claim 2, wherein said width and height dimensions of said tip and ring conductive traces are selected so as to correspond to a particular gauged wire size.

4. A primary/secondary surge protector circuit as claimed in claim 1, wherein said second narrow section of said tip and ring conductive traces has width and height dimensions which are selected so as to correspond to a particular gauge wire size.

5. A primary/secondary surge protector circuit as claimed in claim 1, wherein said voltage suppressor means is comprised of a silicon avalanche suppressor.

6. A primary/secondary surge protector circuit as claimed in claim 1, wherein said voltage suppressor means is comprised of a sidactor.

7. A primary/secondary surge protector circuit as claimed in claim 1, wherein said voltage suppressor means is comprised of a gas discharge tube.

8. A primary/secondary surge protector circuit as claimed in claim 3, wherein said width dimension is approximately 0.040 inches and wherein said height dimension is approximately 0.0028 inches.

9. A primary/secondary surge protector circuit as claimed in claim 4, wherein said width dimension is approximately 0.020 inches and wherein said height dimension approximately 0.0028 inches.

10. A primary/secondary surge protector circuit for protecting telecommunications equipment and the like from power and transient surges, comprising:

a printed circuit board;

surge protector means;

said surge protector means being mounted on said printed circuit board;

said printed circuit board having at least one tip conductive trace formed on its surface and extending between an input terminal pin and a first internal node and having at least one ring conductive trace formed on its surface and extending between an input ring terminal pin and a second internal node;

said surge protector means including voltage suppressor means operatively connected to said tip conductive trace at said first node and to said ring conductive trace at said second node;

said surge protector means further including a first heat coil operatively connected also to said first internal node downstream of said tip conductive trace and a second heat coil operatively connected also to said second internal node downstream of said ring conductive trace;

said tip and ring conductive traces defining fusible links which are opened when an excessive current is passed therethrough; and each of said tip and ring conductive traces having a first wider section, a second narrow section, and a third wider section, said second narrow section being interconnected between said first and third wider sections.

11. A primary/secondary surge protector circuit as claimed in claim 10, wherein each of said tip and ring conductive traces has uniform width and height dimensions.

12. A primary/secondary surge protector circuit as claimed in claim 11, wherein said width and height dimensions of said tip and ring conductive traces are selected so as to correspond to a particular gauged wire size.

13. A primary/secondary surge protector circuit as claimed in claim 10, wherein said second narrow section of said tip and ring conductive traces has width and height dimensions which are selected so as to correspond to a particular gauge wire size.

14. A primary/secondary surge protector circuit for protecting telecommunications equipment and the like from power and transient surges, comprising:

a tip conductive trace formed on a surface of a printed circuit board;

a ring conductive trace formed also on the surface of the printed circuit board;

voltage suppressor means operatively connected between said tip and ring conductive traces for conducting in response to an excessive voltage applied across said tip and ring conductive traces;

said tip and ring conductive traces defining fusible links which are opened when an excessive current is passed therethrough; and each of said tip and ring conductive traces having a first wider section, a second narrow section, and a third wider section, said second narrow section being interconnected between said first and third wider sections.

15. A primary/secondary surge protector circuit as claimed in claim 14, wherein each of said tip and ring conductive traces has uniform width and height dimensions.

16. A primary/secondary surge protector circuit as claimed in claim 15, wherein said width and height dimensions of said tip and ring conductive traces are selected so as to correspond to a particular gauged wire size.

17. A primary/secondary surge protector circuit as claimed in claim 14, wherein said second narrow section of said tip and ring conductive traces has width and height dimensions which are selected so as to correspond to a particular gauge wire size.

\* \* \* \* \*